United States Patent [19]
Matsuki

[11] Patent Number: 5,973,969
[45] Date of Patent: Oct. 26, 1999

[54] DEFECTIVE MEMORY CELL ADDRESS DETECTING CIRCUIT

[75] Inventor: Syouzi Matsuki, Tokyo, Japan

[73] Assignee: NEC Corporation, Tokyo, Japan

[21] Appl. No.: 09/138,010

[22] Filed: Aug. 21, 1998

[30] Foreign Application Priority Data

Aug. 21, 1997 [JP] Japan .................................. 9-224949

[51] Int. Cl.$^6$ .................................................. G11C 7/00
[52] U.S. Cl. ...................... 365/200; 365/154; 365/203; 365/225.7
[58] Field of Search .............. 365/200, 225.7, 365/203, 154, 96

[56] References Cited

U.S. PATENT DOCUMENTS

| | | | |
|---|---|---|---|
| 5,586,075 | 12/1996 | Miwa | 365/200 X |
| 5,742,547 | 4/1998 | Lee | 365/200 |
| 5,768,198 | 6/1998 | Movoo | 365/200 |
| 5,777,931 | 7/1998 | Kwon et al. | 365/200 |
| 5,825,698 | 10/1998 | Kim et al. | 365/200 |

FOREIGN PATENT DOCUMENTS 0 763 794 A2  3/1997  European Pat. Off. .

*Primary Examiner*—Do Hyun Yoo
*Attorney, Agent, or Firm*—McGinn & Gibb, P.C.

[57] ABSTRACT

In a semiconductor memory including a memory cell array and a redundant memory cell array, a defective memory cell address detecting circuit includes a precharge transistor for precharging a COMP signal line of outputting a signal indicative of whether or not an input address is an address of the defective memory cell, and a plurality of detection transistors connected in parallel to the COMP signal line. Each of the detection transistors has a gate connected to receive, through a wired connection, a corresponding bit and its inverted bit of bits of the input address signal. Thus, the number of detection transistors connected in parallel to the COMP signal line can be reduced to a half of the number required in the prior art.

20 Claims, 5 Drawing Sheets

DEFECTIVE MEMORY CELL ADDRESS DETECTING CIRCUIT

BACKGROUND OF THE INVENTION

1. Field of the Invention

The present invention relates to a semiconductor memory, and more specifically to a defective memory cell address detecting circuit used in a semiconductor memory so configured to be recovered by replacing a defective memory cell with a redundant memory cell.

2. Description of Related Art

In the prior art, in many cases, this type of semiconductor memory has such a redundant construction that, when a defective memory cell exists in a memory cell array in which data is written and read in accordance with an address designated by an address signal supplied from an external, the defective memory cell is replaced with a previously prepared redundant memory cell, so that the whole of the chip is saved from a small amount of defective memory cells. In this case, there is provided a defective memory cell address detecting circuit for discriminating whether or not a given address is the address of the defective memory cell. This type of semiconductor memory having the redundant memory cell array in addition to the memory cell array is disclosed in, for example, U.S. Pat. No. 5,586,075 and European Patent EP 0 763 794 A2, the content of both of which is incorporated by reference in its entirety into this application.

Referring to FIG. 5, there is shown a circuit diagram for illustrating one example of the prior art defective memory cell address detecting circuit.

As shown in FIG. 5, the shown prior art example includes fuses f1, f3, f5 and f7 having one end receiving address bits A0T, A1T, A2T and A3T of an address signal, respectively, inverters Inv1, Inv2, Inv3 and Inv4 receiving the address bits A0T, A1T, A2T and A3T, respectively, for outputting inverted address bits A0N, A1N, A2N and A3N, respectively, fuses f2, f4, f6 and f8 having one end receiving the inverted address bits A0N, A1N, A2N and A3N, respectively, and source-grounded MOS transistors Tr1 to Tr8 having a gate connected to the other end of the fuses f1 to f8, respectively, so that at least one of these MOS transistors is turned on when an address other than the address of the defective memory cell is inputted. The shown circuit also includes a MOS transistor Tr18 having a drain connected to a power supply voltage, a gate connected to receive a precharge signal P, and a source connected to a drain of each of the MOS transistors Tr1 to Tr8, for precharging a signal line L$_{COMP}$ for outputting a signal indicative of the result of the defective memory cell address detection. This signal will be called a "COMP signal" in this specification.

With this arrangement, in the case that a defective memory cell exists in the memory cell array, there are cut off only ones so selected from the fuses f1 to f8 as to maintain all of the MOS transistors Tr1 to Tr8 in an OFF condition only when an external address indicates the address of the defective memory cell. For example, assuming that the memory cell at the address (A0T, A1T, A2T, A3T)=(0, 1, 1, 0) is defective, if the fuses f2, f3, f5 and f8 are cut off, all the MOS transistors Tr1 to Tr8 are maintained in the OFF condition only when the external address indicates the address of the defective memory cell, and any one of the MOS transistors Tr1 to Tr8 is turned on when the external address indicates an address other than the address of the defective memory cell.

Now, an operation of the defective memory cell address detecting circuit constructed as mentioned above will be described.

First, the MOS transistor Tr18 is put in an ON condition during a predetermined period of time by the precharge signal P supplied from an external. Thus, the signal line L$_{COMP}$ for the COMP signal is precharged to a high level. On the other hand, the defective address detection is carried out after completion of this precharging.

When the external address indicates an address of a non-defective memory cell in the memory cell array, since any one of the MOS transistors Tr1 to Tr8 is turned on, the signal line L$_{COMP}$ for the COMP signal is brought to a low level.

However, when the external address indicates the address of the defective memory cell in the memory cell array, since all of the MOS transistors Tr1 to Tr8 are maintained in the OFF condition, the signal line L$_{COMP}$ for the COMP signal is maintained at the high level.

When the COMP signal is at the low level, the memory cell array is maintained in an operating condition, and on the other hand, the redundant memory cell is maintained in a non-operating condition. When the COMP signal is at the high level, the memory cell array is put in the non-operating condition, and on the other hand, the redundant memory cell is put in the operating condition.

As mentioned above, even if the defective memory cell exists in the memory cell array, the whole of the chip can be recovered by replacing the defective memory cell with a previously prepared redundant memory cell.

In the above mentioned prior art defective memory cell address detecting circuit, the MOS transistor for receiving the address signal and the MOS transistor receiving the inverted signal of the address signal are provided independently for each bit of the address, and fuses are cut off which are selected from among the fuses connected to the MOS transistors so as to maintain all the MOS transistors in the OFF condition only when the external address signal designates the address of the defective memory cell. Accordingly, the transistors connected to the cut-off fuses become unnecessary for detecting the address of the defective memory address.

Here, if the number of unnecessary transistors becomes large, a load capacitance of the signal line L$_{COMP}$ for the COMP signal indicative of the result of the defective memory cell address detection becomes large, with the result that a significant signal delay occurs.

SUMMARY OF THE INVENTION

Accordingly, it is an object of the present invention to provide a defective memory cell address detecting circuit used in a semiconductor memory, which has overcome the above mentioned problem of the prior art defective memory cell address detecting circuit.

Another object of the present invention is to provide a defective memory cell address detecting circuit used in a semiconductor memory, capable of reducing the load capacitance of the signal indicative of the result of the defective memory cell address detection.

The above and other objects of the present invention are achieved in accordance with the present invention by a semiconductor memory including:

a memory cell array which is composed of a plurality of memory cells and in which data is written and read in accordance with an address designated by an external address signal;

a redundant memory cell array which is composed of redundant memory cells and in which data is written and read in place of the memory cell array when a defective memory cell exists in the memory cell array; and a defective memory cell address detecting circuit for discriminating whether or not an input address is an address of the defective memory cell, the defective memory cell address detecting circuit including:

a first group of fuses of the same number as the bit number of the address signal, and connected to receive bits of the address signal, respectively, a second group of fuses of the same number as the bit number of the address signal, and connected to receive bits of an inverted signal of the address signal, respectively, and a first group of transistors of the same number as the bit number of the address signal, for detecting the address of the defective memory cell on the basis of the address signal through the first group of fuses and the inverted signal of the address signal through the second group of fuses, the address signal and the inverted signal of the address signal being connected to a gate of the first group of transistors through a wired-connection.

In a preferred embodiment of the semiconductor memory, the defective memory cell address detecting circuit further includes a second group of transistors for controlling passage of the address signal and the inverted signal of the address signal through the first and second group of fuses, and a flipflop for generating a signal for controlling an operation of the second group of transistors.

In addition, the flipflop generates a signal for putting the second group of transistors into the conducting condition only when the defective memory cell exists.

Furthermore, the first group of transistors are turned off during a period for precharging a defective address detection signal.

With the above mentioned arrangement, the non-inverted signal and the inverted signal of each bit of the address signal are connected by a wired connection and supplied to the gate of a corresponding transistor of the first group of transistors. Thus, the number of transistors in the first group of transistors can be reduced to a half of the number of transistors required in the prior art, and therefore, the load capacitance of the COMP signal indicative of the result of the defective memory cell address detection can be reduced.

The above and other objects, features and advantages of the present invention will be apparent from the following description of preferred embodiments of the invention with reference to the accompanying drawings.

DESCRIPTION OF THE PREFERRED EMBODIMENTS

First Embodiment

Figure 1:
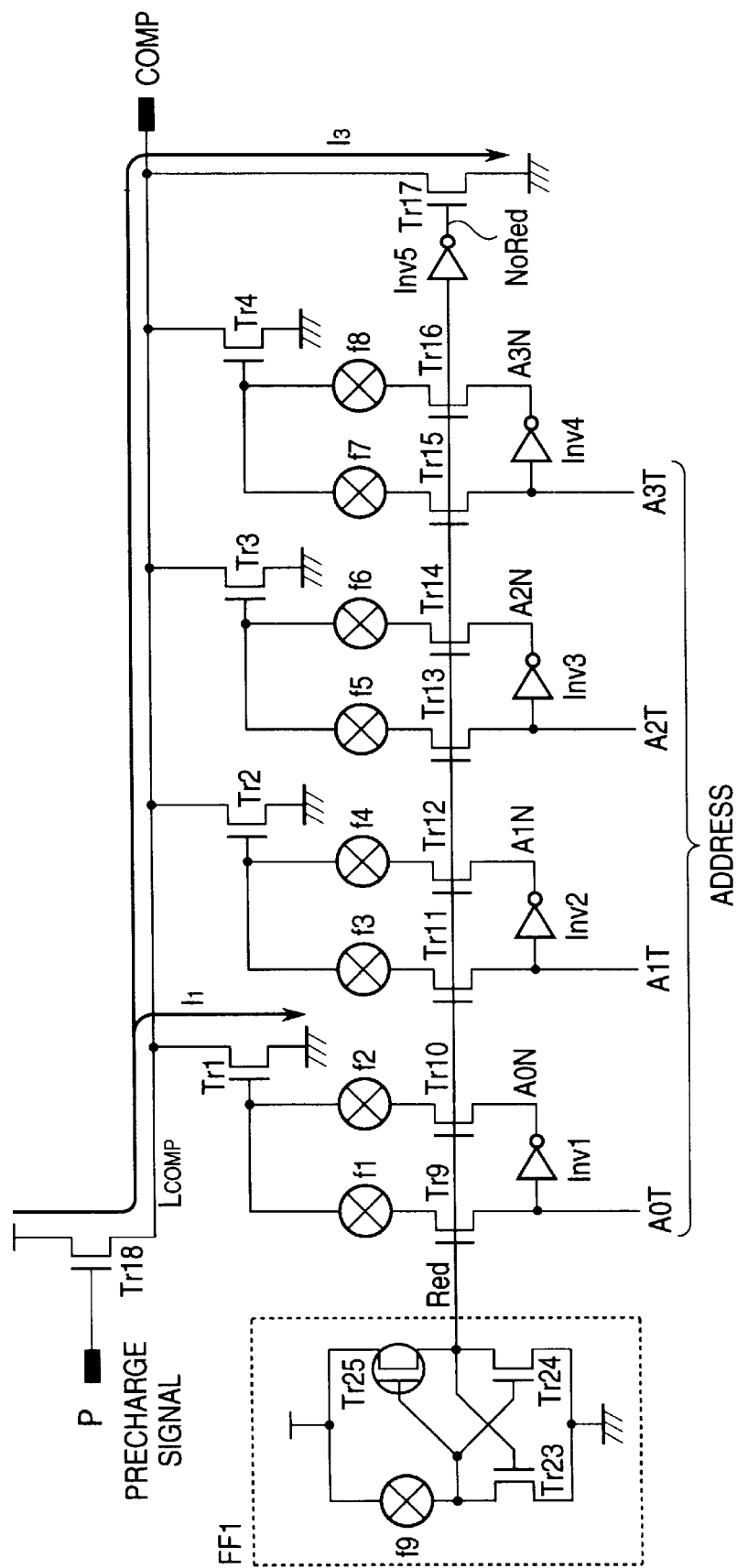
FIG. 1 is a circuit diagram of a first embodiment of the defective memory cell address detecting circuit used in the semiconductor memory in accordance with the present invention.

Referring to FIG. 1, there is shown a circuit diagram of a first embodiment of the defective memory cell address detecting circuit used in the semiconductor memory in accordance with the present invention.

The shown embodiment includes a flipflop FF1 for generating a redundancy enable signal Red, nMOS transistors Tr9, Tr11, Tr13 and Tr15 having a source connected to receive address bits A0T, A1T, A2T and A3T of the address signal, respectively, and a gate connected in common to receive the redundancy enable signal Red for controlling passage/cutoff of the address bits A0T, A1T, A2T and A3T, inverters Inv1, Inv2, Inv3 and Inv4 receiving the address bits A0T, A1T, A2T and A3T, respectively, for outputting inverted address bits A0N, A1N, A2N and A3N, respectively, and nMOS transistors Tr10, Tr12, Tr14 and Tr16 having a source connected to receive the inverted address bits A0N, A1N, A2N and A3N, respectively, and a gate connected in common to receive the redundancy enable signal Red for controlling passage/cutoff of the inverted address bits A0N, A1N, A2N and A3N.

The shown embodiment also includes a first fuse group composed of fuses f1, f3, f5 and f7 having one end connected to a drain of the nMOS transistors Tr9, Tr11, Tr13 and Tr15, respectively, and a second fuse group composed of fuses f2, f4, f6 and f8 having one end connected to a drain of the nMOS transistors Tr10, Tr12, Tr14 and Tr16, respectively.

Furthermore, the shown embodiment includes a source-grounded nMOS transistor Tr1 having a drain connected to a signal line L$_{COMP}$ and a gate connected in common to the other end of the fuses f1 and f2, so as to be turned on when an address other than the defective memory cell address is inputted, a source-grounded nMOS transistor Tr2 having a drain connected to the signal line L$_{COMP}$ and a gate connected in common to the other end of the fuses f3 and f4, so as to be turned on when an address other than the defective memory cell address is inputted, a source-grounded nMOS transistor Tr3 having a drain connected to the signal line L$_{COMP}$ and a gate connected in common to the other end of the fuses f5 and f6, so as to be turned on when an address other than the defective memory cell address is inputted, and a source-grounded nMOS transistor Tr4 having a drain connected to the signal line L$_{COMP}$ and a gate connected in common to the other end of the fuses f7 and f8, so as to be turned on when an address other than the defective memory cell address is inputted.

Moreover, the shown embodiment includes an nMOS transistor Tr18 having a drain connected to a power supply voltage, a gate connected to receive a precharge signal P and a source connected at the signal line L$_{COMP}$ in common to a drain of the nMOS transistors Tr1 to Tr4, for precharging the signal line L$_{COMP}$ for a COMP signal indicative of the result of the defective memory cell address detection, and an nMOS transistor Tr17 connected between the signal line L$_{COMP}$ and the ground and having a gate connected to an output of an inverter Inv5 having an input receiving the redundancy enable signal Red. Therefore, a gate of the nMOS transistor Tr17 receives an inverted signal NoRed of the redundancy enable signal Red.

The flipflop FF1 internally includes a fuse f9 and is so configured to generate the redundancy enable signal Red of a high level if the fuse f9 is cut off. In brief, one end of the fuse f9 is connected to the power supply voltage, and the other and of the fuse f9 is connected to a drain of a source-grounded nMOS transistor Tr23, a gate of another source-grounded nMOS transistor Tr24, and a gate of a pMOS transistor Tr25, which has a source connected to the power supply voltage and a drain connected to a drain of the source-grounded nMOS transistor Tr24 and a gate of the source-grounded nMOS transistor Tr23. The redundancy enable signal Red is outputted from the connection node between the transistors Tr24 and Tr25. When the fuse f9 is conductive, since the drain potential of the MOS transistor Tr23 is higher than the drain potential of the MOS transistor Tr24, the MOS transistors Tr23 and Tr25 are off and the MOS transistor Tr24 is on, so that the redundancy enable signal Red takes the low level. If the fuse f9 is cut off, since the drain potential of the MOS transistor Tr23 becomes the ground level, the MOS transistor Tr25 is on and the MOS transistor Tr24 is off, so that the redundancy enable signal Red takes the high level.

Incidentally, the MOS transistors Tr1 to Tr4 constitute a first group of transistors, and the MOS transistors Tr9 to Tr16 constitute a second group of transistors.

In the above mentioned construction, the non-inverted signal (A0T, A1T, A2T, A3T) and the inverted signal (A0N, A1N, A2N, A3N) of each bit of the address signal is connected to each other in a wired connection at the other end of the fuses f1 to f8, so that these signals are inputted to the gate of the transistors Tr1 to Tr4 for bringing the COMP signal indicative of the result of the defective memory cell address detection, into the low level. For example, the non-inverted address bit A0T supplied through the transistor Tr9 and the fuse f1 and the inverted address bit A0N supplied through the transistor Tr10 and the fuse f2 are supplied through the wired connection to the gate of the transistor Tr1.

In addition, at a redundancy P/W time, and when there is no defective memory cell, the transistor Tr17 is turned on by the inverted signal NoRed of the redundancy enable signal Red, to bring the COMP signal to the low level in order to put a memory cell array in an operating condition and a redundant memory cell in a non-operating condition. Therefore, if the fuse f9 is not cut off, the redundancy enable signal Red is maintained at the low level, and its inverted signal NoRed is at the high level, so that the transistor Tr17 is maintained in the ON condition, and therefore, the redundant memory cell is not substituted for any memory cell in the memory cell array.

The fuses f1 to f8 are selectively cut off to bring all the transistors Tr1 to Tr4 into the OFF condition only when the external address designates the address of the defective memory cell, in the case that the defective memory cell exists in the memory cell array.

Now, an operation of the defective memory cell address detecting circuit constructed as mentioned above will be described with reference to FIG. 2 which is a timing chart for illustrating an operation of the defective memory cell address detecting circuit shown in FIG. 1.

In the case that a defective memory cell exists in the memory cell array, the fuse f9 is cut off, and fuses so selected from the fuses f1 to f8 as to bring all the transistors Tr1 to Tr4 into the OFF condition only when the external address designates the address of the defective memory cell, are cut off.

Figure 2:
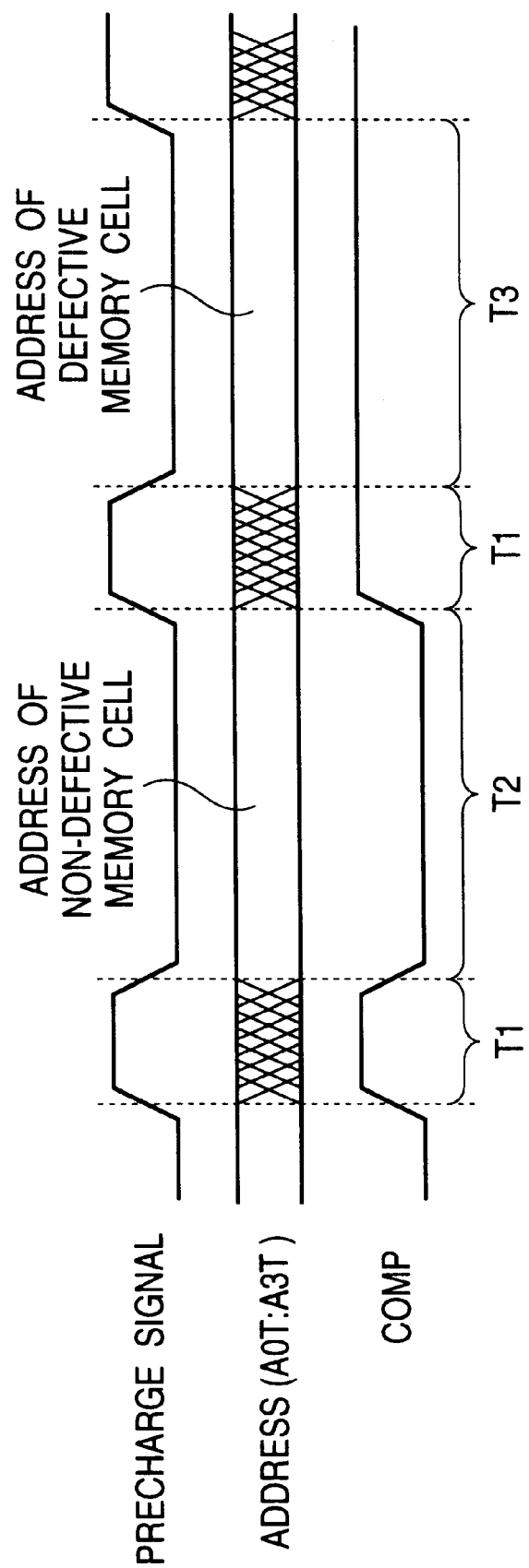
FIG. 2 is a timing chart for illustrating an operation of the defective memory cell address detecting circuit shown in FIG. 1.

In an operation of the memory, first, the transistor Tr18 is put in an ON condition during a predetermined period of time (T1 in FIG. 2) by the precharge signal P supplied from an external, so that the COMP signal is precharged to a high level as shown in FIG. 2. On the other hand, the defective memory cell address detection is carried out after completion of this precharging.

When the external address indicates an address of a non-defective memory cell in the memory cell array, since any one of the transistors Tr1 to Tr4 is turned on, the COMP signal is brought to a low level (T2 in FIG. 2).

However, when the external address indicates the address of the defective memory cell in the memory cell array, since all of the transistors Tr1 to Tr4 are maintained in the OFF condition, the COMP signal is maintained at the high level (T3 in FIG. 2).

When the COMP signal is at the low level, the memory cell array is maintained in an operating condition, and on the other hand, the redundant memory cell is maintained in a non-operating condition. When the COMP signal is at the high level, the memory cell array is put in the non-operating condition, and on the other hand, the redundant memory cell is put in the operating condition.

Second Embodiment

Figure 3:
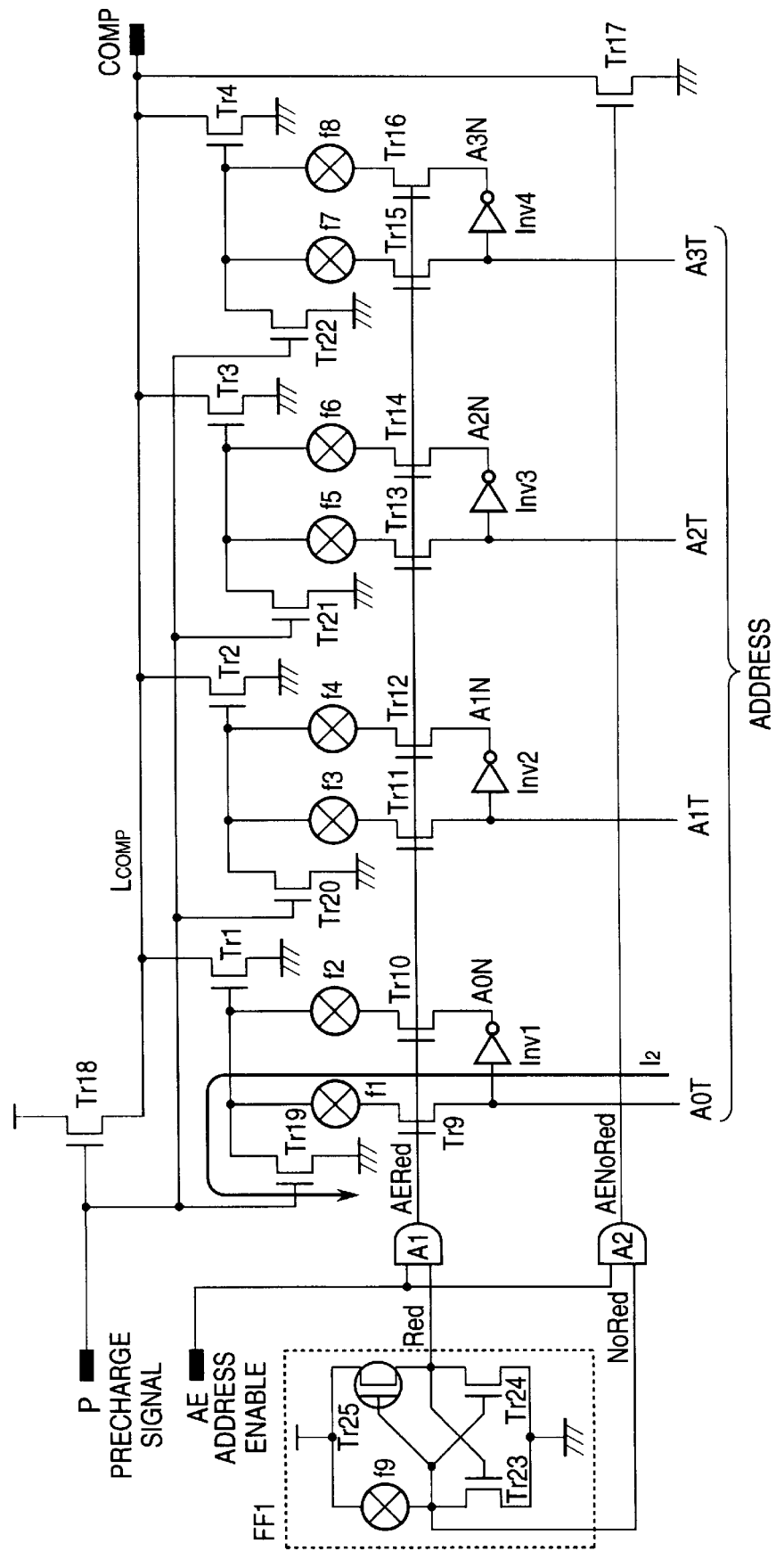
FIG. 3 is a circuit diagram of a second embodiment of the defective memory cell address detecting circuit used in the semiconductor memory in accordance with the present invention.

FIG. 3 is a circuit diagram of a second embodiment of the defective memory cell address detecting circuit used in the semiconductor memory in accordance with the present invention.

This second embodiment is configured to prevent a pass-through current occurring in the first embodiment shown in FIG. 1. Therefore, in FIG. 3, elements corresponding to those shown in FIG. 1 are given the same Reference Numerals, and only portions differing from the first embodiment will be described in the following.

In the circuit shown in FIG. 1, a pass-through current flows from the transistor Tr18 through any one of the transistors Tr1 to Tr4 to the ground, as indicated by for example a current I1 in FIG. 1. In order to prevent this pass-through current I1, the second embodiment includes source-grounded nMOS transistors Tr19 to Tr22 having a drain connected to the gate of the transistors Tr1 to Tr4, respectively, and a gate connected in common to receive the precharge signal P. Thus, during a precharging period in which the precharge signal P is at the high level, the transistors Tr19 to Tr22 are put in the ON condition so as to output the low level to the gate of the transistors Tr1 to Tr4, so that the transistors Tr1 to Tr4 are maintained in the OFF condition during the precharging period. Therefore, no pass-through current I1 flows during the precharging period.

The second embodiment also includes an AND gate A1 receiving the redundancy enable signal Red outputted from the flipflop FF1 and an address enable signal AE which is an inverted signal of the precharge signal P and which is maintained at the high level during a period in which an effective address is outputted, and another AND gate A2 receiving the address enable signal AE and the inverted signal NoRed of the redundancy enable signal Red, which can be obtained from a connection node between the fuse f9 and the transistor Tr23 in the flipflop FF1. Here, a signal outputted from the AND gate A1 is called an AERed signal, and a signal outputted from the AND gate A2 is called an AENoRed signal.

Here, when the fuse f9 is in a cutoff condition, there is a possibility that during the precharge period, a pass-through current flows from the address signal (the non-inverted address signal A0T, A1T, A2T, A3T or the inverted address signal A0N, A1N, A2N, A3N) through the transistors Tr19 to Tr22 to the ground, as shown by for example a current I2 in FIG. 3. In order to prevent this pass-through current I2, the AERed signal is supplied to the gate of the transistors Tr9 to Tr16 so that these transistors Tr9 to Tr16 are maintained in the OFF condition during the precharge period, and therefore, none of the non-inverted address signal A0T, A1T, A2T, A3T and the inverted address signal A0N, A1N, A2N, A3N can flow through the transistors Tr9 to Tr16 and hence through the transistors Tr19 to Tr22.

On the other hand, when the fuse f9 is in a conducting condition, a pass-through current I3 as shown in FIG. 1 flows through the transistors Tr17 and Tr18 during the precharge period. In order to prevent this pass-through current I3, the AENoRed signal is supplied to the gate of the transistors Tr17. Therefore, when the AENoRed signal is at the low level, the transistors Tr17 is maintained in the OFF condition.

Figure 4A:
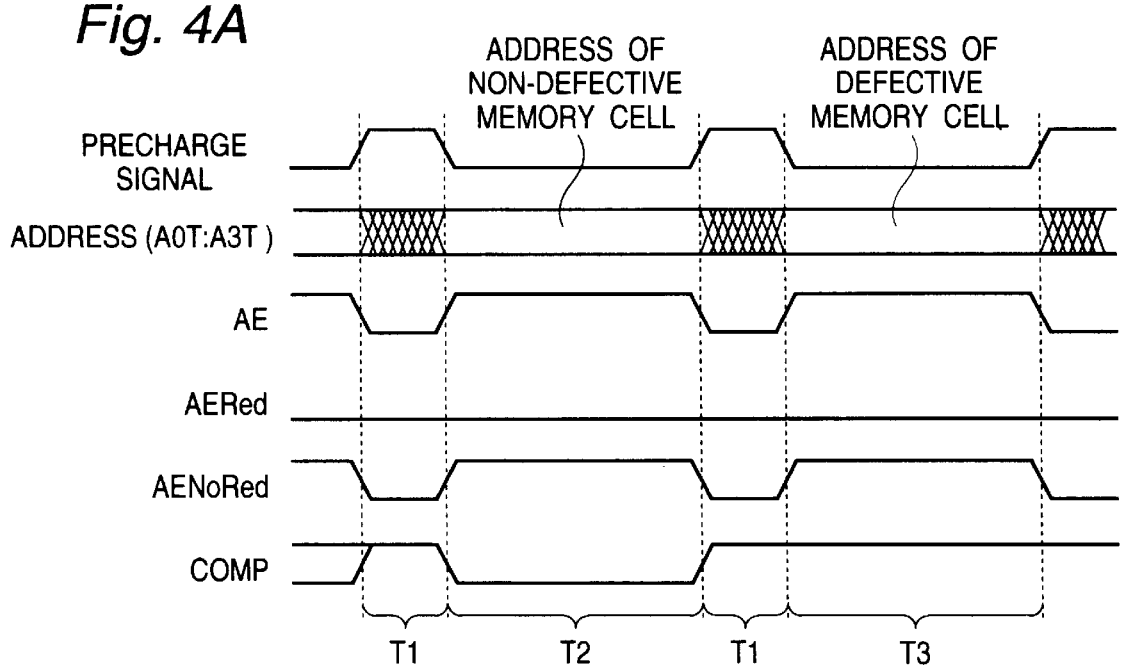
FIGS. 4A and 4B are timing charts for illustrating an operation of the defective memory cell address detecting circuit shown in FIG. 3 in the case that the fuse is not cut off and in the case that the fuse is cut off.
Figure 4B:
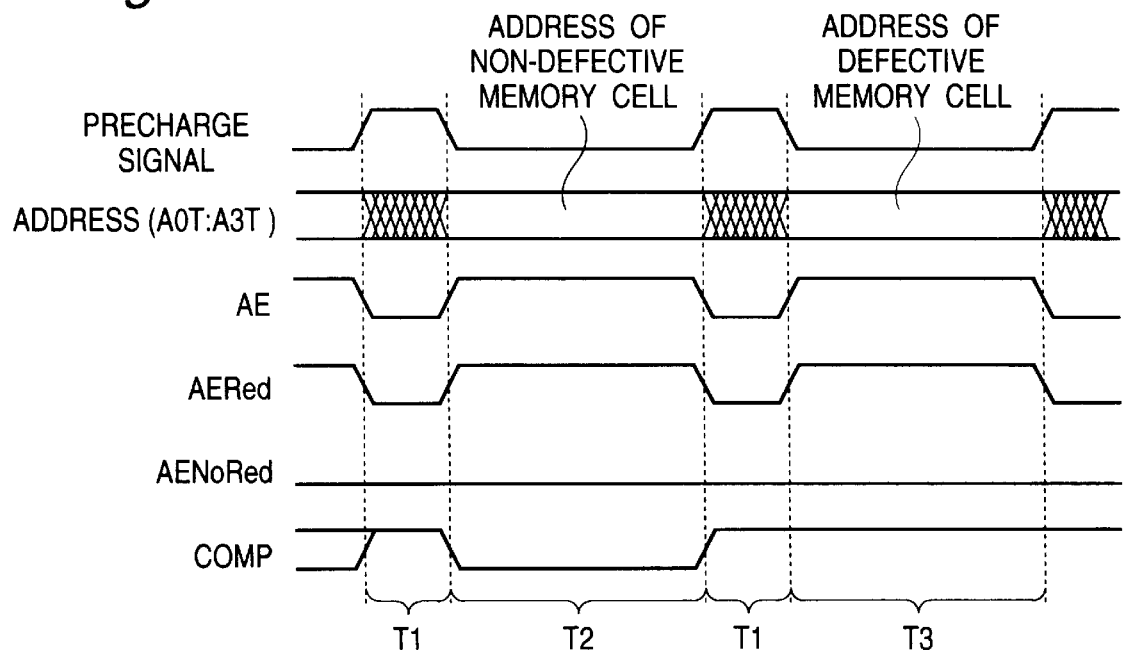
Figure 5:
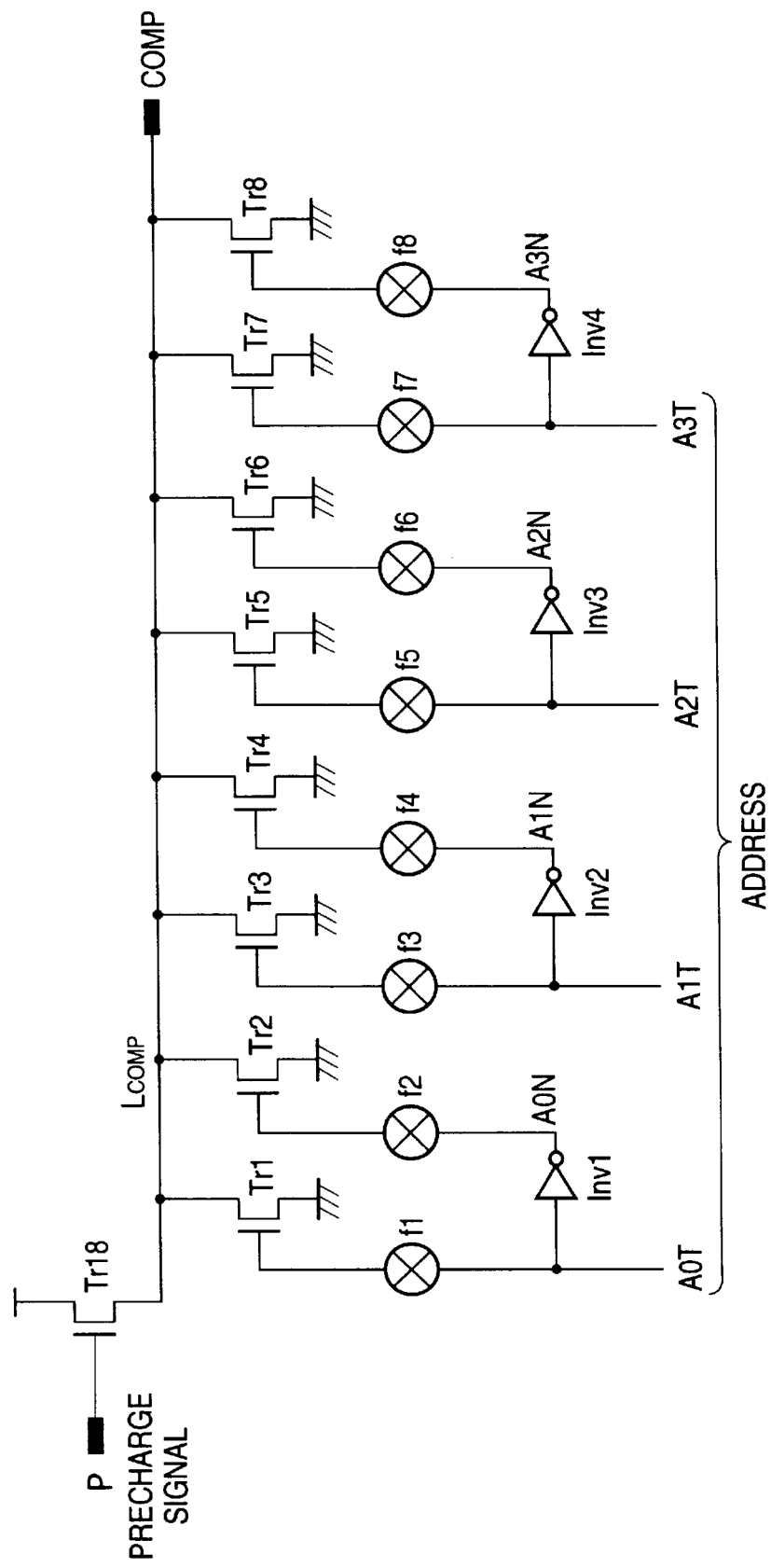
FIG. 5 is a circuit diagram of an example of the prior art defective memory cell address detecting circuit.

Now, an operation of the second embodiment of the defective memory cell address detecting circuit constructed as mentioned above will be described with reference to FIGS. 4A and 4B, which are timing charts for illustrating an operation of the defective memory cell address detecting circuit shown in FIG. 3. FIG. 4A shows the timing chart in the case that the fuse f9 is in the conducting condition, and FIG. 4B shows the timing chart in the case that the fuse f9 is in the cutoff condition.

Here, since the operation concerning the defective memory address detection is the same as that of the first embodiment, an explanation thereof will be omitted, and only an operation of the circuit concerning the prevention of the pass-through currents I2 and I3 will be described.

When the fuse f9 is in the conducting condition, since the redundancy enable signal Red is maintained at the low level, the AERed signal is also maintained at the low level as shown in FIG. 4A, and therefore, all of the transistors Tr9 to Tr16 are maintained in the OFF condition, with the result that no pass-through current I2 flows from the address signal through the transistors Tr9 to Tr16 and the transistors Tr19 to Tr22.

On the other hand, since the invented signal NoRed is maintained at the high level in the case that the fuse f9 is in the conducting condition, the AENoRed signal is brought to the low level during the precharge period T1 as shown in FIG. 4A, so that the transistor Tr17 is turned off, with the result that no pass-through current I3 flows through the transistors Tr18 and Tr17 during the precharge period.

When the fuse f9 is in the cutoff condition, since the invented signal NoRed is maintained at the low level, the AENoRed signal is also maintained at the low level as shown in FIG. 4B, so that the transistor Tr17 is turned off, with the result that no pass-through current I3 flows through the transistors Tr18 and Tr17.

On the other hand, since the redundancy enable signal Red is maintained at the high level in the case that the fuse f9 is in the cutoff condition, the AERed signal is brought to the low level during the precharge period T1 as shown in FIG. 4B, and therefore, all of the transistors Tr9 to Tr16 are brought in the OFF condition, with the result that no pass-through current I2 flows from the address signal through the transistors Tr9 to Tr16 and the transistors Tr19 to Tr22 during the precharge period T1.

The above mentioned defective memory cell address detecting circuit is provided in a semiconductor memory which includes a memory cell array which is composed of a plurality of memory cells and in which data is written and read in accordance with an address designated by an external address signal, and a redundant memory cell array which is composed of redundant memory cells and in which data is written and read in place of the memory cell array when a defective memory cell exists in the memory cell array. In this semiconductor memory, if a defective memory cell exists in the memory cell array, when the external address signal disengage an address of the defective memory cell, the defective memory cell is replaced with a redundant memory cell in the redundant memory cell array. Thus, the memory chip can be relieved from a small amount of defective memory cells.

As mentioned above, in the defective memory cell address detecting circuit used in the semiconductor memory in accordance with the present invention, the non-inverted signal and the inverted signal of each bit of the address signal are connected by a wired connection and supplied to the gate of a corresponding transistor of the first group of transistors. Thus, the number of transistors in the first group of transistors can be reduced to a half of the number of transistors required in the prior art, and therefore, the load capacitance of the COMP signal indicative of the result of the defective memory cell address detection can be reduced.

Therefore, the operation of the signal indicative of the result of the defective memory cell address detection can be speeded up.

The invention has thus been shown and described with reference to the specific embodiments. However, it should be noted that the present invention is in no way limited to the details of the illustrated structures but changes and modifications may be made within the scope of the appended claims.

I claim:
1. A semiconductor memory including:
    a memory cell array including a plurality of memory cells and in which data is written and read in accordance with an address designated by an external address signal;
    a redundant memory cell array including redundant memory cells and in which data is written and read in place of said memory cell array when a defective memory cell exists in said memory cell array; and
    a defective memory cell address detecting circuit for discriminating whether or not an input address comprises an address of said defective memory cell,
    said defective memory cell address detecting circuit including:
        a first group of fuses of the same number as the bit number of said address signal, and connected to receive bits of said address signal, respectively,
        a second group of fuses of the same number as the bit number of said address signal, and connected to receive bits of an inverted signal of said address signal, respectively, and
        a first group of transistors of the same number as the bit number of said address signal, for detecting said address of said defective memory cell on the basis of said address signal through said first group of fuses and said inverted signal of said address signal through said second group of fuses,
        a respective one of said address signal and said inverted signal of said address signal both being connected to a gate of a same transistor of said first group of transistors through a wired-connection.
2. A semiconductor memory claimed in claim 1, wherein said defective memory cell address detecting circuit further includes a second group of transistors for controlling passage of said address signal and said inverted signal of said address signal through said first and second group of fuses.

3. A semiconductor memory claimed in claim 1, wherein said defective memory cell address detecting circuit further includes a flipflop operatively coupled to said first and second group of fuses, for generating a control signal.

4. A semiconductor memory claimed in claim 1, wherein said defective memory cell address detecting circuit has a ratio of a sum of the number of said first group of fuses and the number of said second group of fuses, to the number of said first group of transistors which is no less than 2:1.

5. A semiconductor memory including:
a memory cell array including a plurality of memory cells and in which data is written and read in accordance with an address designated by an external address signal;
a redundant memory cell array including redundant memory cells and in which data is written and read in place of said memory cell array when a defective memory cell exists in said memory cell array; and
a defective memory cell address detecting circuit for discriminating whether or not an input address comprises an address of said defective memory cell,
said defective memory cell address detecting circuit including:
a first group of fuses of the same number as the bit number of said address signal, and connected to receive bits of said address signal, respectively,
a second group of fuses of the same number as the bit number of said address signal, and connected to receive bits of an inverted signal of said address signal, respectively, and
a first group of transistors of the same number as the bit number of said address signal, for detecting said address of said defective memory cell on the basis of said address signal through said first group of fuses and said inverted signal of said address signal through said second group of fuses,
said address signal and said inverted signal of said address signal being connected to a gate of said first group of transistors through a wired-connection,
wherein said defective memory cell address detecting circuit further includes a second group of transistors for controlling passage of said address signal and said inverted signal of said address signal through said first and second group of fuses, and a flipflop for generating a signal for controlling an operation of said second group of transistors.

6. A semiconductor memory claimed in claim 5 wherein said flipflop generates a signal for putting said second group of transistors into the conducting condition only when said defective memory cell exists.

7. A semiconductor memory claimed in claim 6 wherein said first group of transistors are turned off during a period for precharging a defective address detection signal.

8. A semiconductor memory including:
a memory cell array including a plurality of memory cells and in which data is written and read in accordance with an address designated by an external address signal;
a redundant memory cell array including redundant memory cells and in which data is written and read in place of said memory cell array when a defective memory cell exists in said memory cell array; and
a defective memory cell address detecting circuit for discriminating whether or not an input address comprises an address of said defective memory cell,
said defective memory cell address detecting circuit including:
a signal line for outputting a signal indicative of whether or not the input address comprises the address of said defective memory cell,
a pre-charge transistor connected between a power supply voltage and said signal line and having a gate connected to receive a pre-charge signal so that when said pre-charge signal is active, said pre-charge transistor is turned on to pre-charge said signal line,
a first group of transistors of the same number as the bit number of said address signal, a source/drain path of each of said first group of transistors being connected between said signal line and ground,
a first group of fuses of the same number as the bit number of said address signal, one end of each of said first group of fuses being connected to a gate of a corresponding one of said first group of transistors, and the other end of each of said first group of fuses receiving a corresponding bit of bits of said address signal, and
a second group of fuses of the same number as the bit number of said address signal, one end of each of said second group of fuses being connected to a gate of a corresponding one of said first group of transistors, and the other end of each of said second group of fuses receiving an inverted bit of a corresponding bit of bits of said address signal,
so that the one end of the fuse included in said first group of fuses and having the other end receiving the corresponding bit of bits of said address signal and the one end of the fuse included in said second group of fuses and having the other end receiving the inverted bit of the same corresponding bit of bits of said address signal, are both connected to the gate of a same, corresponding transistor of said first group of transistors through a wired connection.

9. A semiconductor memory claimed in claim 8, wherein said defective memory cell address detecting circuit further includes a second group of transistors for controlling passage of said address signal and said inverted signal of said address signal through said first and second group of fuses.

10. A semiconductor memory claimed in claim 8, wherein said defective memory cell address detecting circuit further includes a flipflop operatively coupled to said first and second group of fuses, for generating a control signal.

11. A semiconductor memory claimed in claim 8, wherein said defective memory cell address detecting circuit further includes a second group of transistors of twice the bit number of said address signal.

12. A semiconductor memory claimed in claim 11, wherein said defective memory cell address detecting circuit further includes a gate of each of said second group of transistors being connected to receive a redundancy enable signal.

13. A semiconductor memory claimed in claim 11, wherein said defective memory cell address detecting circuit further includes:
one end of opposite ends of a source/drain path of said second group of transistors being connected to the other end of said first and second groups of fuses, and
the other end of opposite ends of a source/drain path of said second group of transistors being connected to receive non-inverted bits and inverted bits of bits of said address signal, respectively.

14. A semiconductor memory claimed in claim 8, wherein said defective memory cell address detecting circuit has a ratio of a sum of the number of said first group of fuses and the number of said second group of fuses, to the number of said first group of transistors which is no less than 2:1.

15. A semiconductor memory including:
    a memory cell array including a plurality of memory cells and in which data is written and read in accordance with an address designated by an external address signal;
    a redundant memory cell array including redundant memory cells and in which data is written and read in place of said memory cell array when a defective memory cell exists in said memory cell array; and
    a defective memory cell address detecting circuit for discriminating whether or not an input address comprises an address of said defective memory cell,
    said defective memory cell address detecting circuit including:
        a signal line for outputting a signal indicative of whether or not the input address comprises the address of said defective memory cell,
        a pre-charge transistor connected between a power supply voltage and said signal line and having a gate connected to receive a pre-charge signal so that when said pre-charge signal is active, said pre-charge transistor is turned on to pre-charge said signal line,
        a first group of transistors of the same number as the bit number of said address signal, a source/drain path of each of said first group of transistors being connected between said signal line and ground,
        a first group of fuses of the same number as the bit number of said address signal, one end of each of said first group of fuses being connected to a gate of a corresponding one of said first group of transistors, and the other end of each of said first group of fuses receiving a corresponding bit of bits of said address signal, and
        a second group of fuses of the same number as the bit number of said address signal, one end of each of said second group of fuses being connected to a gate of a corresponding one of said first group of transistors, and the other end of each of said second group of fuses receiving an inverted bit of a corresponding bit of bits of said address signal,
        so that the one end of the fuse included in said first group of fuses and having the other end receiving the corresponding bit of bits of said address signal and the one end of the fuse included in said second group of fuses and having the other end receiving the inverted bit of the same corresponding bit of bits of said address signal, are connected to the gate of a corresponding transistor of said first group of transistors through a wired connection,
    wherein said defective memory cell address detecting circuit further includes a second group of transistors of twice the bit number of said address signal, a gate of each of said second group of transistors being connected to receive a redundancy enable signal, one end of opposite ends of a source/drain path of said second group of transistors being connected to the other end of said first and second groups of fuses, respectively, the other end of opposite ends of a source/drain path of said second group of transistors being connected to receive non-inverted bits and inverted bits of bits of said address signal, respectively.

16. A semiconductor memory claimed in claim 15 wherein said defective memory cell address detecting circuit further includes a discharge transistor connected between said signal line and the ground and having a gate connected to an inverted signal of said redundancy enable signal, so that when said redundancy enable signal is inactive, said signal line is maintained at a low level.

17. A semiconductor memory claimed in claim 16 wherein said defective memory cell address detecting circuit further includes a flipflop internally including a fuse and so configured to generate said redundancy enable signal of an inactive level when said fuse in said flipflop is in a conducting condition and said redundancy enable signal of an active level when said fuse in said flipflop is in a cutoff condition.

18. A semiconductor memory claimed in claim 15 wherein said defective memory cell address detecting circuit further includes a third group of transistors of the same number as the bit number of said address signal, a source/drain path of said third group of transistors being connected between the ground and the gate of said first group of transistors, respectively, a gate of each of said third group of transistors being connected to receive said precharge signal so that when said precharge signal is active, all of said third group of transistors are in an ON condition, so as to maintain all of said first group of transistors in an OFF condition.

19. A semiconductor memory claimed in claim 18 wherein said defective memory cell address detecting circuit further includes a first AND gate receiving an inverted signal of said precharge signal and said redundancy enable signal and having an output connected to the gate of all said second group of transistors, a second AND gate receiving said inverted signal of said precharge signal and an inverted signal of said redundancy enable signal, a discharge transistor connected between said signal line and the ground and having a gate connected to an output of said second AND gate, so that when said redundancy enable signal is inactive, said signal line is maintained at a low level.

20. A semiconductor memory claimed in claim 19 wherein said defective memory cell address detecting circuit further includes a flipflop internally including a fuse and so configured to generate said redundancy enable signal of an inactive level when said fuse in said flipflop is in a conducting condition and said redundancy enable signal of an active level when said fuse in said flipflop is in a cutoff condition.

* * * * *